(12) United States Patent
Bhowmik et al.

(10) Patent No.: US 6,331,484 B1
(45) Date of Patent: Dec. 18, 2001

(54) TITANIUM-TANTALUM BARRIER LAYER FILM AND METHOD FOR FORMING THE SAME

(75) Inventors: Siddhartha Bhowmik; Sailesh Mansinh Merchant; Minseok Oh; Pradip Kumar Roy; Sidhartha Sen, all of Orlando, FL (US)

(73) Assignee: Lucent Technologies, Inc., Muray Hill, NJ (US)

(*) Notice: Subject to any disclaimer, the term of this patent is extended or adjusted under 35 U.S.C. 154(b) by 0 days.

(21) Appl. No.: 09/519,193

(22) Filed: Mar. 6, 2000

Related U.S. Application Data
(60) Provisional application No. 60/126,681, filed on Mar. 29, 1999, and provisional application No. 60/135,565, filed on May 24, 1999.

(51) Int. Cl.⁷ .............................................. H01L 21/4763
(52) U.S. Cl. ..................... 438/648; 438/627; 438/643; 438/656; 438/685; 438/687; 257/751
(58) Field of Search .................................. 438/627, 643, 438/648, 653, 656, 685, 687; 257/751

(56) References Cited

U.S. PATENT DOCUMENTS

| 5,930,669 | * | 7/1999 | Uzoh .................................... 438/627 |
| 6,054,398 | * | 4/2000 | Pramanick ........................... 438/784 |

OTHER PUBLICATIONS

Ryu et al., "Barriers for Copper Interconnections"; *Solid State Technology*, pp. 53–56, Apr. 1999.
Tsai et al., "Comparison of the Diffusion Barrier Properties of Chemical–Vapor–Deposited TaN and Sputtered TaN Between Cu and Si", *Journal Applied Physics*, vol. 79, pp. 6932–6938, May 1, 1996.
Park et al., "The Effect of Density and Microstructure on the Performance of TiN Barrier Films in Cu Metallization", *Journal Applied Physics*, vol. 80, pp. 5674–5681, Nov. 15, 1996.

Chang et al., "Amorphouslike Chemical Vapor Deposited Tungsten Diffusion Barrier for Copper Metallization and Effects of Nitrogen Addition", *J. Applied Physics*, vol. 82, pp. 1469–1475, Aug. 1, 1997.

* cited by examiner

*Primary Examiner*—Charles Bowers
*Assistant Examiner*—Hsien-Ming Lee

(57) ABSTRACT

A titanium-tantalum barrier layer film for use in conjunction with an interconnect film such as copper and a method for forming the same provides a relatively titanium rich/tantalum deficient portion adjacent the interface it forms with a dielectric film and a relatively tantalum rich/titanium deficient portion adjacent the interface it forms with a conductive interconnect film formed over the barrier layer film. The titanium rich/tantalum deficient portion provides good adhesion to the dielectric film and the tantalum rich/titanium deficient portion forms a hetero-epitaxial interface with the interconnect film and suppresses the formation of inter-metallic compounds. A single titanium-tantalum film having a composition gradient from top-to-bottom may be formed using various techniques including PVD, CVD, sputter deposition using a sputtering target of homogeneous composition, and sputter deposition using multiple sputtering targets. A composite titanium-tantalum film consists of two separately formed films.

41 Claims, 2 Drawing Sheets

TITANIUM-TANTALUM BARRIER LAYER FILM AND METHOD FOR FORMING THE SAME

RELATED APPLICATIONS

This application claims priority of U.S. Provisional Application Ser. No. 60/126,681, inventors Jonathon M. Lobbins, Lauri M. Nelson, Siddhartha Bhowmik, Sailesh M. Merchant, Pradip K. Roy, Sidhartha Sen, and Minseok Oh, entitled DETECTION OF MAGNETICALLY INDUCED PLASMA CHARGING FROM PASSIVATION USING C.O.S. TECHNIQUES, filed on Mar. 29, 1999.

This application also claims priority of U.S. Provisional Application Ser. No. 60/135,565, inventors Siddhartha Bhowmik, Sailesh M. Merchant, Minseok Oh, Pradip K. Roy, and Sidhartha Sen, entitled USE OF TITANIUM-TANTALUM ALLOY AS A DIFFUSION BARRIER MATERIAL FOR COPPER INTERCONNECTS, filed on May 24, 1999.

FIELD OF THE INVENTION

The present invention relates generally to semiconductor integrated circuit devices. More particularly, the present invention relates to integrated circuit devices containing a titanium-tantalum barrier layer film, and also to the methods for manufacturing such integrated circuit devices.

BACKGROUND OF THE INVENTION

It is generally desirable in semiconductor integrated circuit devices to provide barrier layer films for use in conjunction with conductive materials, such as those used as interconnect devices or wiring layers. Conductive materials are generally isolated from other features of semiconductor integrated circuit devices by means of a dielectric material. In damascene processing, the interconnect structure or wiring pattern is formed within grooves or other openings formed within a dielectric film. In non-damascene processing techniques, the conductive, interconnect structures are formed over a dielectric film.

Barrier layer films are needed between the dielectric material and the conductive material in order to prevent portions of the conductive material from migrating through the dielectric material and into other active device features. Such migration can cause inter-level or intra-level shorts through the dielectric material. When portions of the conductive material migrate into underlying silicon such as a silicon substrate commonly used in the semiconductor industry, various device performance characteristics can be adversely affected. For example, junction leakage may result, and threshold voltage ($V_t$) levels of the transistors formed within the silicon substrate, may be shifted. In many cases, device functionality can be destroyed.

The above effects are of a particular concern when copper (Cu) is used as the conductive interconnect material since copper is most mobile throughout semiconductor structures. Copper is favored in the semiconductor integrated circuit manufacturing industry because of its superior conductivity. As such, when copper is used as the conductive material within damascene structures, the conductive copper material must be virtually encapsulated within a barrier layer film. Barrier layer films have come into use to separate conductive films such as copper from the dielectric films over which, or in which, they are formed. Barrier layer materials also find utility in contact regions wherein a conductive film is contacted to another conductive film, or to a region of a semiconductor device. In this application, the barrier layer material suppresses spiking between the conductive materials, or between the conductive material and the semiconductor material.

The art of semiconductor manufacturing provides a number of conventional barrier materials. Each of the conventional barrier materials includes a limitation, however, which limits its effectiveness when used in conjunction with copper films which are most desirable in the art, but which are also most mobile throughout semiconductor structures. An example of a barrier material conventionally used in conjunction with copper, is tantalum (Ta). A drawback associated with the use of tantalum in this application, is the inability of tantalum to adhere satisfactorily with conventionally used dielectric films such as silicon dioxide (alternatively referred to as "oxide"). Because of the limitations associated with the use of tantalum, tantalum nitride (TaN) has also been used as a barrier material in conjunction with copper. Tantalum nitride (TaN) offers the advantage that it adheres well to oxides and other dielectric films. A drawback associated with the use of tantalum nitride as a barrier layer material, however, lies in the poor atomic matching between tantalum nitride and copper along the interface formed between the materials. As such, a Cu—TaN film structure is more highly strained then a Cu—Ta film structure. Atomic matching between copper and tantalum nitride is deficient on certain atomic planes.

Other materials proposed and sometimes used as barrier layer materials in conjunction with copper, also exhibit shortcomings which make them unsuitable for use in conjunction with copper films. For example, titanium nitride (TiN) also exhibits poor atomic matching on certain atomic planes along the interface it forms with copper. Pure titanium (Ti) is generally considered unsuitable for use as a barrier layer material in conjunction with copper, because titanium combines with copper to form an inter-metallic compound which lowers the conductivity of the copper film. Titanium is a material which adheres well to dielectric materials such as oxides.

What is needed in the art is a barrier layer material suitable for use in conjunction with copper and other conductive materials, which adheres well to oxide and other dielectric films, and which produces a low strain or a hetero-epitaxial relationship with the conductive film with which it forms an interface. An object of the present invention is to provide such a barrier layer film, and a method for forming the same.

SUMMARY OF THE INVENTION

To achieve these and other objects, and in view of its purposes, the present invention provides a titanium-tantalum barrier layer film and method for forming the same. This barrier layer film is particularly suited for use in conjunction with copper. The titanium-tantalum barrier layer film may be a composite film or a single film having a concentration gradient. A first surface of the film is titanium rich/tantalum deficient to provide for good adhesion to an underlying dielectric material such as commonly used in the art. The opposed surface of the film is titanium deficient/tantalum rich to provide for hetero-epitaxial bonding with the conductive material, and to avoid the undesired formation of inter-metallic compounds which lower the conductivity of the conductive material.

The present invention also provides a method for forming the composite film and the single film having a concentration gradient. The method for forming the composite film may include a sputter deposition process using one or more sputtering targets. The method and barrier layer films produced are suitable for both damascene and non-damascene processing techniques.

DETAILED DESCRIPTION OF THE INVENTION

The present invention provides a method and structure for barrier layer films consisting of titanium and tantalum. Each of the barrier layer films of the present invention are relatively titanium rich at the portion of the film which forms a contiguous surface with a dielectric material, and relatively tantalum rich at the portion of the film which forms a contiguous surface with the conductive material. The barrier layer film formed according to the present invention may be used in damascene or non-damascene processing applications.

Figure 1:
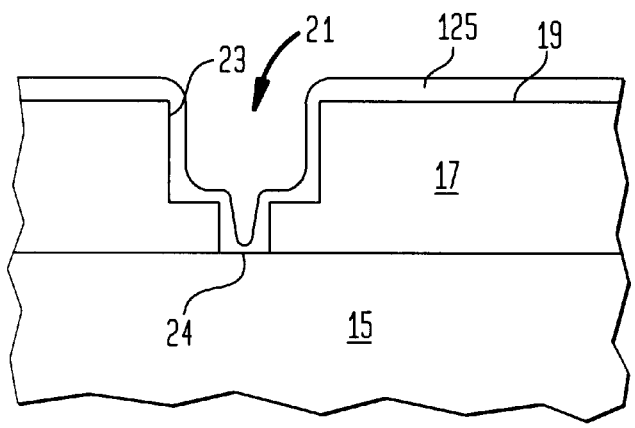
FIG. 1 is a cross-sectional view of a first embodiment of the barrier layer film formed according to the present invention.

FIG. 1 shows a damascene opening 21 formed within dielectric film 17 which is formed over underlying layer 15. Underlying layer 15 may be any layer above which dielectric film 17 is formed. According to one exemplary embodiment, underlying layer 15 may be the substrate, such as a silicon substrate commonly used in the semiconductor processing industry. According to another exemplary embodiment, underlying layer 15 may be a conductive film wherein opening 21 is used to provide contact between a conductive layer to be formed within opening 21, and the conductive film below. In another exemplary embodiment, underlying layer 15 may be a further dielectric material, in which case the cross-section shown in FIG. 1 is simply a cross-sectional view of the damascene opening formed in a region where subjacent contact is not being made. Dielectric film 17 may be any suitable dielectric film used in the semiconductor manufacturing industry, such as an oxide (silicon dioxide) or nitride (silicon nitride) film. Dielectric film 17 may be formed by any of various methods, including by chemical vapor deposition and spin-on techniques.

Opening 21 formed within dielectric film 17, may be formed using conventional methods. Opening 21 is a two-tiered structure commonly referred to as a dual damascene opening. It should be understood that the present invention is not intended to be limited to structures formed in dual damascene openings. Rather, openings having various configurations such as vias, grooves, trenches or single damascene openings, may be used alternatively. Damascene opening 21 includes sidewalls 23 and bottom surface 24. Bottom surface 24 may be an upper surface of underlying layer 15. Barrier layer film 125 is a titanium-tantalum barrier layer film having a concentration gradient as will be described in conjunction with FIG. 2. Barrier layer film 125 is formed on exposed surfaces which include top surface 19 of dielectric film 17, and sidewalls 23 and bottom surface 24 of opening 21. Barrier layer film 125 does not fill damascene opening 21 completely.

EXAMPLE 1 titanium-tantalum Barrier Layer Film Having a Concentration Gradient

Figure 2:
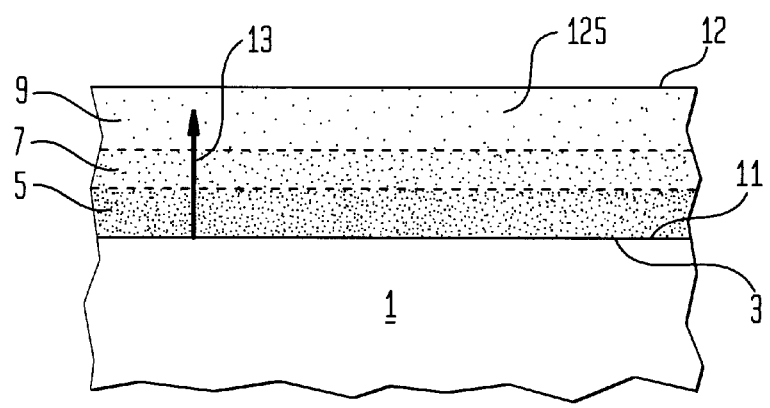
FIG. 2 is an expanded cross-sectional view of a first embodiment of the barrier layer film formed according to the present invention.

Now turning to FIG. 2, an expanded view of titanium-tantalum barrier layer film 125 is shown. Titanium-tantalum layer 125 is formed over exposed surface 3 of underlying material 1. Underlying material 1 may be a suitable dielectric as commonly used in the semiconductor processing industry such as an oxide film formed using CVD. Exposed surface 3 may be the top surface of a dielectric film such as top surface 19 shown in FIG. 1, or it may represent sidewalls or a bottom surface of an opening formed in a dielectric film such as shown by features 23 and 24, respectively, of FIG. 1. At any rate, leading surface 11 of the deposited film is formed on exposed surface 3.

Titanium-tantalum film 125 consists of titanium and tantalum and includes a gradient of the relative proportions of the two components throughout the depth of the film. It should be understood that the leading surface of a deposited film is the first, or leading, section formed during the deposition process. Since titanium-tantalum barrier layer film 125 is deposited onto exposed surface 3 as shown in FIG. 2, leading surface 11 of titanium-tantalum barrier layer film 125 is the bottom section shown in FIG. 2. Conversely, the top section of the film terminates at trailing surface 12, the top surface of film 125.

The relative concentration of titanium within the film having a concentration gradient, is maximized in the portion of the film adjacent exposed surface 3, and decreases along direction 13 which extends perpendicularly away from the interface region formed between film 125 and exposed surface 3 of underlying material 1. As such, it can be seen that the weight percentage of titanium in lower section 5 is greater than that in central section 7 which, in turn is greater than that in upper section 9. Conversely, the relative weight concentration of tantalum within film 125 is at a minimum in the interface region formed between leading surface 11 of film 125, and exposed surface 3 of underlying material 1. The relative weight concentration of tantalum within the film increases along direction 13 which extends perpendicularly away from exposed surface 3. As such, the relative weight concentration of tantalum within the film is at a minimum in lower section 5, is increased in central section 7, and is maximized in upper section 9. It should be understood that, with respect to both tantalum and titanium, regions 5, 7 and 9 are arbitrarily chosen to exhibit the gradient of relative weight concentrations of the components within the film. The film, as produced, includes a relatively titanium rich/tantalum deficient region in the portion of the film adjacent exposed surface 3 onto which it is deposited. The portion of the film nearest top surface 12 will, conversely, be relatively tantalum rich and titanium deficient. The relative weight concentrations of titanium and tantalum form a gradient which changes along direction 13, and is not intended to be limited to three distinct and distinguishable different regions within the film. In an exemplary embodiment, the gradient may be a gradual and continuous gradient.

The titanium-tantalum film so produced, provides the following features. The portion of the film in lower section 5 is titanium rich and tantalum deficient and allows leading surface 11 to adhere well to underlying dielectric films, such as oxide films. Upper section 9 of titanium-tantalum film 125 is tantalum rich and titanium deficient providing for trailing surface 12 to form a hetero-epitixial relationship with a conductive film such as copper which may be formed on upper surface 12. Because region 9 and upper surface 12 are titanium deficient, the interaction of copper and titanium is suppressed, which precludes formation of undesirable inter-metallic compounds. Such inter-metallic compounds lower the conductivity of the copper film.

According to a first exemplary embodiment, titanium-tantalum film 125 is formed using a sputtering process which may be carried out in any conventional sputtering tool available in the art. A homogenous sputtering target having a uniform titanium-tantalum composition throughout, is used. By applying power and energizing the target thereby enabling sputtering of the target material, the film is produced as described because of the relative atomic weights of the elements titanium (atomic weight: 48) and tantalum (atomic weight: 181). When a current is applied to a homogeneous target formed of titanium and tantalum, it is a natural consequence of the sputtering process that titanium, which is a lighter element, is sputtered off the target first and at a higher velocity. As such, during such a sputter deposition process, titanium will preferentially be the component which is sputter-deposited onto the exposed surface initially. Titanium is lighter and "lands first" on the surface onto which the film is being sputter-deposited. As the sputtering process continues, the titanium is preferentially sputtered off of the homogeneous target. This exposes more tantalum, which is then eventually sputtered from the target. In this manner, a film having a leading surface which is relatively titanium rich/tantalum deficient and trailing sections which are relatively tantalum rich/titanium deficient, may be formed from a sputtering target formed of titanium and tantalum and having a homogeneous composition of the components, throughout.

It should be pointed out that the titanium-tantalum barrier layer film 125 formed according to the first exemplary embodiment and having a concentration gradient along direction 13 perpendicular to the interface it forms with the surface upon which it is deposited, may be formed from any of various homogeneous sputtering targets having different titanium-tantalum ratios. It is an aspect of the present invention, however, that regardless of the overall, generally homogeneous composition of the sputtering target, the film produced by sputtering contains more titanium at the leading surface than at the trailing surface and less tantalum at the leading surface than at the trailing surface.

According to a second exemplary embodiment, titanium-tantalum barrier layer film 125 having a concentration gradient along direction 13 as described in conjunction with FIG. 2, may be formed using a sputter deposition process which uses two separate sputtering targets. According to the second exemplary embodiment, both a titanium sputtering target and a tantalum sputtering target are included within the sputtering apparatus. The two targets may be included within the same deposition chamber. Shutters may be used to prevent poisoning of target surfaces by cross-contamination. The targets are separately controllable and are each adapted to separately and individually deposit a film onto the exposed surfaces of a substrate positioned within the sputtering apparatus. The amount of material sputtered from each target is proportional to, and thus can be controlled by, the amount of current or power applied to the sputtering target. By simultaneously supplying currents to each of the sputtering targets, materials are simultaneously sputtered from both targets onto the exposed surface, thus producing a film containing both titanium and tantalum. By varying the relative power, amperage and/or voltage supplied to the sputtering targets, films having varying concentrations of titanium and tantalum can be produced.

According to the second exemplary embodiment, conditions are chosen so that a greater amount of titanium is sputtered onto the exposed surfaces of the substrate than tantalum, during the initial stages of the sputtering process used to form the described film. As such, a film section which is relatively titanium-rich is formed initially. As the sputtering process continues, the power provided to the sputtering targets is adjusted so that relatively more tantalum is sputtered, producing a film having a higher tantalum/titanium concentration ratio as formed. Sputtering process conditions are again varied so that the trailing edge of the composite film has a tantalum/titanium concentration ratio which is greater still. In this manner, the sputtering conditions are chosen so that a tantalum-rich, titanium-tantalum film is produced at the trailing edge.

It should again be emphasized that the three discrete film sections described in conjunction with FIG. 2, are exemplary only. In the preferred embodiment, the relative amounts of titanium and tantalum sputtered onto the surface, change gradually as the relative power supplied to the two targets is changed continuously. In this manner a titanium-tantalum film having a gradually changing concentration gradient, is formed.

According to third exemplary embodiment for forming a titanium-tantalum barrier layer film 125 having a concentration gradient along direction 13 as described in conjunction with FIG. 2, the titanium-tantalum barrier layer film 125 is formed using physical or chemical vapor deposition techniques. Examples of chemical vapor deposition (CVD) techniques include plasma enhanced chemical vapor deposition (PECVD), low pressure chemical vapor deposition (LPCVD), and metallo-organic chemical vapor deposition (MOCVD).

For each of the above deposition techniques according to the third exemplary embodiment, the deposition conditions are changed during the course of the deposition process so that a titanium-tantalum film which is relatively titanium-rich, is formed initially and wherein the relative concentration of titanium within the titanium-tantalum film is decreased during the deposition process to produce the titanium-tantalum barrier layer film having the concentration gradient as described above. For example, the deposition process may include an inlet gas containing titanium and another inlet gas containing tantalum. In the case of MOCVD, the deposition process may include an inlet gas containing a titanium-containing precursor and another inlet gas containing a tantalum-containing precursor. The relative flow rates of the two gasses may be altered during the deposition process to produce the film as described above.

It should be understood that various other deposition techniques may be used to produce a titanium-tantalum barrier layer film having a concentration gradient wherein the film is relatively titanium-rich at the leading edge and relatively tantalum-rich at the trailing edge. Generally speaking the rate of titanium deposition and the rate of tantalum deposition will be separately controllable. During the deposition process which includes simultaneous deposition of the two components to form a film consisting of a mixture of the two, the relative rates of deposition will be varied to produce the titanium-tantalum film as described in conjunction with FIG. 2. That is, relatively more tantalum will be deposited as the deposition process proceeds.

In an exemplary embodiment, a heat treatment of short duration may additionally follow the deposition process used to form the titanium-tantalum film having the concentration gradient, in order to promote the migration of titanium towards the interface region formed with a dielectric material.

EXAMPLE 2

Composite Titanium-Tantalum Barrier Layer Film

Figure 3:
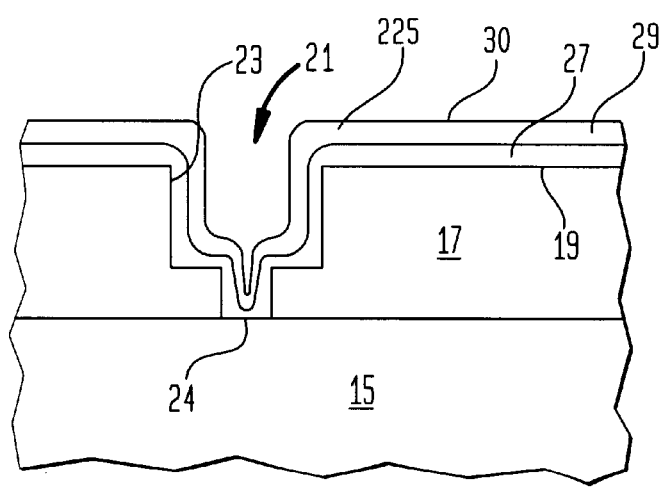
FIG. 3 is a cross-sectional view of a second exemplary embodiment of the barrier layer film formed according to the present invention.

FIG. 3 shows a fourth exemplary embodiment of the titanium-tantalum barrier layer film formed according to the present invention. In FIG. 3, similarly-labeled features are as described in conjunction with FIG. 1. In FIG. 3, titanium-tantalum film 225 is a composite film consisting of a lower titanium film 27 and a separately formed, upper tantalum film 29. This fourth exemplary embodiment also provides the advantages achieved by the first exemplary embodiment as it provides a titanium-tantalum barrier layer film 225 which includes a lower section being titanium rich/tantalum deficient adjacent underlying surface 19, and an upper section being tantalum rich/titanium deficient.

According to the fourth exemplary embodiment, films 27 and 29 are formed individually. Lower titanium film 27 may be formed using conventional methods such as sputtering, physical vapor deposition (PVD), chemical vapor deposition (CVD), or MOCVD (Metallo-Organic CVD) using organic or pre-organic precursors. Upper tantalum film 29 may be formed using the same conventional deposition processes as described in conjunction with lower titanium film 27. In an exemplary embodiment, each of films 27 and 29 may include a thickness ranging from 5 nanometers to 100 nanometers. Barrier layer film 225 is formed over top surface 19 of dielectric film 17, and also within damascene opening 21. While barrier layer film 225 is formed over bottom surface 24 of damascene opening 21, and along sidewalls 23 of damascene opening 21, it can be seen that barrier layer film 225 does not fill damascene opening 21 completely.

Figure 4:
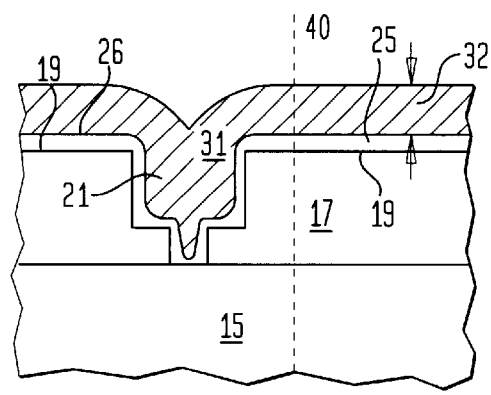
FIG. 4 is a cross-sectional view showing a conductive film formed over the barrier layer film.

FIG. 4 shows conductive film 31 formed over top surface 26 of titanium-tantalum barrier layer film 25. In FIG. 4 and all subsequent figures, titanium-tantalum barrier layer film 25 may represent either of barrier layer film 125 as shown in FIG. 1, or barrier layer film 225 as shown in FIG. 3. Conductive film 31 may be formed by sputter deposition, CVD, PVD, electrodeposition, electroplating or electro-less plating processes. In the preferred embodiment, conductive layer film 31 may be copper, but in alternative embodiments it may be nickel or aluminum. Thickness 32 of conductive film 31 may be any suitable thickness chosen to ensure that conductive film 31 completely fills opening 21. By filling opening 21, it is meant that conductive film 31 fully occupies the portion of opening below the plane formed by upper surface 19 of dielectric film 17.

Figure 5:
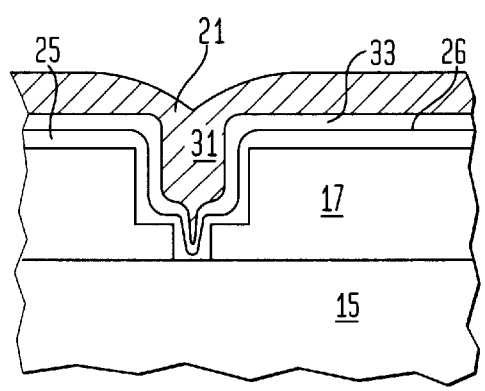
FIG. 5 is a cross-sectional view showing a seed layer film formed between the barrier layer film and the conductive film.

In another exemplary embodiment as shown in FIG. 5, conductive film 31 may be formed by electrodeposition. In this alternative embodiment, a seed layer film 33 is also formed between titanium-tantalum barrier layer film 25 and conductive film 31. In an exemplary embodiment, seed layer film 33 may be formed of copper. Seed layer film 33 may be formed using conventional CVD or PVD methods as available in the art, or it may be formed using electroless plating processes. It can be also seen that seed layer film 33 is formed over top surface 26 of titanium-tantalum barrier layer film 25 and does not completely fill opening 21. As in the embodiment shown in FIG. 4, conductive film 31 which is formed by electrodeposition onto seed layer film 33, completely fills opening 21.

Figure 6:
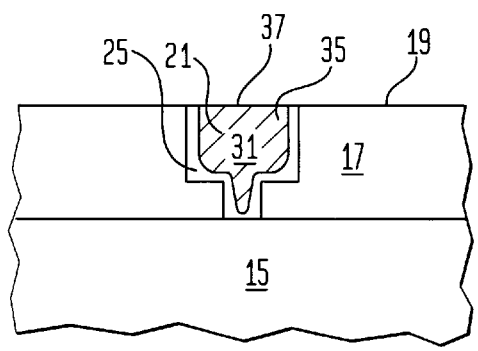
FIG. 6 is a cross-sectional view showing a damascene structure according to an exemplary embodiment, after it has been planarized.

Now turning to FIG. 6, a cross-sectional view of an interconnect structure, or conductive wire 35, is shown. It can be seen that portions of titanium-tantalum barrier layer film 25 and conductive film 31 which lie above the plane formed by upper surface 19 of dielectric film 17, have been removed. In an exemplary embodiment, a polishing operation such as chemical mechanical polishing (CMP) may be used to remove the films and planarize the surface as shown. It can be seen that upper surface 37 of conductive wire 35, is substantially co-planar with upper surface 19 of dielectric film 17. Within opening 21, conductive film 31 is bounded on the sides and the bottom by titanium-tantalum barrier layer film 25. In this damascene structure shown in FIG. 6, copper is the preferred conductive material 31, although nickel and aluminum may be used alternatively. It should be understood that the embodiment shown in FIG. 5, which additionally includes seed layer film 33, may be similarly planarized.

Figure 7:
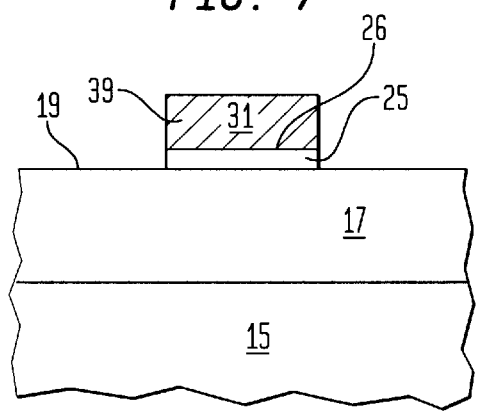
FIG. 7 is a cross-sectional view showing an embodiment of a patterned conductive structure including the barrier layer film of the present invention in a non-damascene application.

FIG. 7 shows another exemplary embodiment of a film structure including a barrier layer film formed according to the present invention. In FIG. 7, the conductive film is formed over a surface of a dielectric material according to non-damascene techniques. This portion of a film formed over a top surface of a substrate may be as shown in region 40 of FIG. 4, for example. Returning to FIG. 7, titanium-tantalum barrier layer film 25 may, again, represent barrier layer film 125, shown and described in conjunction FIG. 1, or barrier layer film 225 shown and described in conjunction with FIG. 3. Titanium-tantalum barrier layer film 25 is formed over surface 19 of dielectric film 17. Conductive film 31, shown and described in conjunction with FIG. 4, is formed over top surface 26 of titanium-tantalum barrier layer film 25. After a blanket layer composite film consisting of conductive film 31 and titanium-tantalum barrier layer film 25 is formed, conventional patterning and etching methods may be used to form a pattern of the composite film to produce conductive wire 39. In this non-damascene structure shown in FIG. 7, aluminum and nickel are the preferred materials to be used as conductive layer film 31, but copper may be used alternatively.

While the present invention is shown and described in conjunction with aluminum, nickel, and copper conductive films, it should be understood that the invention is not intended to be limited to the embodiments shown and described. Rather, the titanium-tantalum barrier layer film including a lower portion being titanium rich/tantalum deficient and an upper section being titanium deficient/tantalum rich, may be used in any application where such a film is suitable. In addition to being formed over a planar surface of a dielectric material, or within a trench opening according to damascene technology, the barrier layer film may be formed over various other features. The barrier layer film and the structures formed using the barrier layer film, may be utilized within various semiconductor devices, and may be formed over the various substrates used in the semiconductor manufacturing industry. The process for forming the barrier layer film according to the present invention, is also not intended to be limited to the formation processes described above. Rather, various other processing techniques may be used to produce the titanium-tantalum barrier layer film. In addition, various other processing operations may be combined to utilize the advantages provided by the described embodiments of the titanium-tantalum barrier layer film. For example, the non-damascene patterned conductive wire shown in FIG. 7 may additionally include a seed layer film formed between the titanium-tantalum barrier layer film and the conductive film, in the exemplary embodiment wherein the conductive layer film is formed by electroplating techniques.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents such as equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed:

1. A process for depositing a film onto a substrate, comprising the steps of:
   a) providing a substrate having a substrate surface;
   b) depositing a titanium-tantalum film over the substrate surface, the film having a gradient of titanium concentration substantially throughout the film, the titanium concentration being maximized at a section of the film nearest the substrate surface, and decreasing along a direction extending perpendicularly away from the substrate surface.

2. The process as in claim 1, in which step b) includes providing a sputtering target within a sputtering apparatus, the sputtering target being formed of a homogenous composition including titanium and tantalum.

3. The process as in claim 1, in which step b) includes providing a titanium sputtering target within a sputtering apparatus and a tantalum sputtering target within the sputtering apparatus, each sputtering target being separately controllable and adapted for sputtering material onto the substrate surface.

4. The process as in claim 1, wherein step b) comprises chemical vapor deposition.

5. The process as in claim 1, wherein step b) comprises physical vapor deposition.

6. A process for depositing a film onto a substrate, comprising the steps of:
   a) providing a substrate having a substrate surface;
   b) depositing a titanium-tantalum film over the substrate surface by providing a sputtering target within a sputtering apparatus, the sputtering target being formed of a homogenous composition including titanium and tantalum, and
   supplying a current to the sputtering target, thereby continuously sputtering the titanium-tantalum film by:
      i. sputtering a lower section of the titanium-tantalum film over the substrate surface, the lower section having a first titanium weight percentage;
      ii. sputtering a central section of the titanium-tantalum film onto the lower section, the central section having a second titanium weight percentage being less than the first titanium weight percentage; and
      iii. sputtering an upper section of the titanium-tantalum film onto the central section, the upper section having a third titanium weight percentage being less than the second titanium weight percentage,
   the titanium-tantalum film having a gradient of titanium concentration therewithin, the titanium concentration being maximized at a section of the film nearest the substrate surface, and decreasing along a direction extending perpendicularly away from the substrate surface.

7. A process for depositing a film onto a substrate, comprising the steps of:
   a) providing a substrate having a substrate surface;
   b) depositing a titanium-tantalum film over the substrate surface by providing a titanium sputtering target within a sputtering apparatus and a tantalum sputtering target within the sputtering apparatus, each sputtering target being separately controllable and adapted for sputtering material onto the substrate surface, and
   supplying a current to the titanium sputtering target and supplying a further current to the tantalum sputtering target, thereby continuously sputtering the titanium-tantalum film by:
      i. sputtering a lower section of the titanium-tantalum film over the substrate surface, the lower section having a first titanium weight percentage;
      ii. sputtering a central section of the titanium-tantalum film onto the lower section, the central section having a second titanium weight percentage being less than the first titanium weight percentage; and
      iii. sputtering an upper section of the titanium-tantalum film onto the central section, the upper section having a third titanium weight percentage being less than the second titanium weight percentage,
   the titanium-tantalum film having a gradient of titanium concentration therewithin, the titanium concentration being maximized at a section of the film nearest the substrate surface, and decreasing along a direction extending perpendicularly away from the substrate surface.

8. The process as in claim 7, further comprising varying at least one of: the amperage of each of the current and the further current; a voltage level of each of the titanium sputtering target and the tantalum sputtering target; and, a power level of each of the titanium sputtering target and the tantalum sputtering target, during step b).

9. A process for forming a semiconductor device comprising:
   a) providing a semiconductor substrate having a dielectric film formed thereon, the dielectric film including a dielectric surface and having an opening formed therein, the opening including sidewalls and a bottom;
   b) depositing a titanium-tantalum barrier layer on the dielectric surface and on the sidewalls and the bottom but not filling the opening;
   c) depositing a conductive film over the barrier layer and filing the opening; and
   d) removing portions of the barrier layer and the conductive film from over a plane formed by the dielectric surface, wherein other portions of the barrier layer and the conductive film remain within the opening,
   wherein the titanium-tantalum barrier layer has a gradient of titanium concentration substantially throughout the layer, the titanium concentration being maximized at a section of the barrier layer nearest to an interface formed between the titanium-tantalum barrier layer and the dielectric film, and decreasing along a direction extending perpendicularly away from the interface.

10. The process as in claim 9, in which step a) includes forming the dielectric film by one of CVD and spin-on techniques.

11. The process as in claim 9, wherein the opening is a dual-damascene trench structure, and step d) comprises chemical mechanical polishing.

12. The process as in claim 9, wherein step b) comprises depositing the titanium-tantalum barrier layer using one of chemical vapor deposition and physical vapor deposition.

13. The process as in claim 9, wherein step c) comprises depositing one of a nickel film and an aluminum film.

14. The process as in claim 9, wherein step c) comprises depositing a copper film.

15. The process as in claim 9, further comprising step b1) forming an electroplating seed layer over the titanium-tantalum barrier layer but not filing the opening therewith and wherein step c) comprises forming a copper film by electrodeposition.

16. A process for forming a semiconductor device comprising:
   a) providing a semiconductor substrate having a dielectric film formed thereon, the dielectric film including a dielectric surface and having an opening formed therein, the opening including sidewalls and a bottom;
   b) forming a titanium film, then forming a tantalum film over the titanium film thereby depositing a titanium-tantalum barrier layer on the dielectric surface and on the sidewalls and the bottom but not filling the opening;
   c) depositing a conductive film over the barrier layer and filing the opening; and
   d) removing portions of the barrier layer and the conductive film from over a plane formed by the dielectric surface, wherein other portions of the barrier layer and the conductive film remain within the opening.

17. The process as in claim 16, wherein each of the titanium film and the tantalum film include a thickness within a range of 5 nanometers to 100 nanometers.

18. The process as in claim 16, wherein step b) comprises forming each of the titanium film and the tantalum film using one of chemical vapor deposition and physical vapor deposition.

19. The process as in claim 16, wherein step b) comprises forming at least one of the titanium film and the tantalum film using Metallo-Organic chemical vapor deposition.

20. A process for forming a semiconductor device comprising:
   a) providing a semiconductor substrate having a dielectric film formed thereon, the dielectric film including a dielectric surface and having an opening formed therein, the opening including sidewalls and a bottom;
   b) depositing a titanium-tantalum barrier layer on the dielectric surface and on the sidewalls and the bottom but not filling the opening by:
      i) providing a sputtering target within a sputtering apparatus, the sputtering target being formed of a homogenous composition including titanium and tantalum;
      ii) positioning the semiconductor substrate within the sputtering apparatus; and
      iii) supplying a current to the sputtering target, thereby sputtering a titanium-tantalum film, the titanium-tantalum film forming the titanium-tantalum barrier layer,
   wherein the titanium-tantalum barrier layer has a gradient of titanium concentration therewithin, the titanium concentration being maximized at a section of the barrier layer nearest an interface formed between the titanium-tantalum barrier layer and the dielectric film, and decreasing along a direction extending perpendicularly away from the interface,
   c) depositing a conductive film over the barrier layer and filing the opening; and
   d) removing portions of the barrier layer and the conductive film from over a plane formed by the dielectric surface, wherein other portions of the barrier layer and the conductive film remain within the opening.

21. The process as in claim 20, wherein step b) further comprises the step iv) of heating the titanium-tantalum barrier layer.

22. The process as in claim 20, wherein step iii) comprises supplying a current to the sputtering target, thereby continuously sputtering the titanium-tantalum film by:
   A. sputtering a lower section of the titanium-tantalum film onto the dielectric surface, the sidewalls, and the bottom, the lower section having a first titanium weight percentage;
   B. sputtering a central section of the titanium-tantalum film onto the lower section, the central section having a second titanium weight percentage being less than the first titanium weight percentage; and
   C. sputtering an upper section of the titanium-tantalum film onto the central section, the upper section having a third titanium weight percentage being less than the second titanium weight percentage.

23. A process for forming a semiconductor device comprising:
   a) providing a semiconductor substrate having a dielectric film formed thereon, the dielectric film including a dielectric surface and having an opening formed therein, the opening including sidewalls and a bottom;
   b) depositing a titanium-tantalum barrier layer on the dielectric surface and on the sidewalls and the bottom but not filling the opening by:

i) positioning the semiconductor substrate within a sputtering apparatus;

ii) providing a titanium sputtering target within the sputtering apparatus and a tantalum sputtering target within the sputtering apparatus, each sputtering target adapted to sputter material onto the semiconductor substrate; and iii) supplying a current to the titanium sputtering target and supplying a further current to the tantalum sputtering target, thereby sputtering a titanium-tantalum film, the titanium-tantalum film forming the titanium-tantalum barrier layer, wherein the titanium-tantalum barrier layer has a gradient of titanium concentration therewithin, the titanium concentration being maximized at a section of the barrier layer nearest an interface formed between the titanium-tantalum barrier layer and the dielectric film, and decreasing along a direction extending perpendicularly away from the interface, c) depositing a conductive film over the barrier layer and filing the opening; and d) removing portions of the barrier layer and the conductive film from over a plane formed by the dielectric surface, wherein other portions of the barrier layer and the conductive film remain within the opening.

24. A process for forming a semiconductor device, comprising the steps of:

a) providing a semiconductor substrate having a dielectric film formed thereon;

b) depositing a titanium-tantalum barrier layer over a dielectric surface of the dielectric film by:

i) providing a sputtering target within a sputtering apparatus, the sputtering target being formed of a homogenous composition including titanium and tantalum;

ii) positioning the semiconductor substrate within the sputtering apparatus; and iii) supplying a current to the sputtering target thereby sputtering a titanium-tantalum film over the dielectric surface, the titanium-tantalum film forming the titanium-tantalum barrier layer, wherein the titanium-tantalum barrier layer has a gradient of titanium concentration therewithin, the titanium concentration decreasing along a direction extending perpendicularly away from the dielectric surface;

c) depositing a conductive film of one of nickel and aluminum over the titanium-tantalum barrier layer thereby forming a composite film of the titanium-tantalum barrier layer and the conductive film; and d) removing portions of the composite film thereby patterning the composite film and forming an interconnect pattern thereof.

25. The process as in claim 24, further comprising step b1) forming an electroplating seed layer over the titanium-tantalum barrier layer, and wherein step c) comprises electroplating, and the composite film further includes the electroplating seed layer.

26. A process for forming a semiconductor device, comprising the steps of:

a) providing a semiconductor substrate having a dielectric film formed thereon;

b) depositing a titanium-tantalum barrier layer over a dielectric surface of the dielectric film by forming a titanium film then forming a tantalum film over the titanium film;

c) depositing a conductive film of one of nickel and aluminum over the titanium-tantalum barrier layer thereby forming a composite film of the titanium-tantalum barrier layer and the conductive film; and d) removing portions of the composite film thereby patterning the composite film and forming an interconnect pattern thereof.

27. A semiconductor device comprising a dielectric layer having an opening formed therein, an exposed surface including a top surface of the dielectric layer and sidewalls and a bottom portion of the opening, and a titanium-tantalum barrier layer formed over the exposed surface, wherein the titanium-tantalum barrier layer comprises a film having a gradient of titanium concentration substantially throughout the film, the titanium concentration decreasing along a direction extending perpendicularly away from the exposed surface.

28. The semiconductor device as in claim 27, further comprising a conductive film formed over the barrier layer.

29. The semiconductor device as in claim 28, wherein the conductive film comprises copper.

30. The semiconductor device as in claim 28, further comprising a seed layer film interposed between the titanium-tantalum barrier layer and the conductive film.

31. The semiconductor device as in claim 28, wherein the conductive film comprises one of nickel and aluminum.

32. The semiconductor device as in claim 27, wherein the titanium concentration is maximized at or near the exposed surface.

33. The semiconductor device as in claim 27, wherein the titanium-tantalum barrier layer comprises a film having a gradient of tantalum concentration therewithin, the tantalum concentration increasing along a direction extending perpendicularly away from the exposed surface.

34. The semiconductor device as in claim 33, wherein the tantalum concentration is minimized at or near the exposed surface.

35. A semiconductor device as in claim 27, wherein the titanium-tantalum barrier layer comprises a film being relatively titanium-rich adjacent the exposed surface and relatively titanium-deficient adjacent an upper surface of the film.

36. A semiconductor device comprising a dielectric layer having an opening formed therein, an exposed surface including a top surface of the dielectric layer and sidewalls and a bottom portion of the opening, and a titanium-tantalum barrier layer formed over the exposed surface, wherein the titanium-tantalum barrier layer comprises a tantalum film having a thickness within a range of 5–100 nanometers, formed over a titanium film having a thickness within a range of 5–100 nanometers.

37. A damascene structure formed within a damascene opening formed within a dielectric film, the dielectric film having a top surface, the damascene opening including sidewalls and a bottom surface, the damascene structure comprising a titanium-tantalum barrier layer formed on the sidewalls and the bottom surface but not filling the opening, a conductive layer formed over the barrier layer and filing the opening, the damascene structure including an upper surface being essentially planar with the top surface, wherein the titanium-tantalum barrier layer includes a leading surface forming an interface with the sidewalls and the bottom surface, and a gradient of titanium concentration substantially throughout the film, the titanium concentration being maximized at or near the interface and decreasing along a direction extending perpendicularly away from the interface.

38. The damascene structure as in claim 37, further comprising a seed layer film interposed between the titanium-tantalum barrier layer and the conductive layer.

39. The damascene structure as in claim 37, wherein the conductive layer comprises copper.

40. The damascene structure as in claim 37, wherein the conductive layer comprises one of nickel and aluminum.

41. A damascene structure formed within a damascene opening formed within a dielectric film, the dielectric film having a top surface, the damascene opening including sidewalls and a bottom surface, the damascene structure comprising a titanium-tantalum barrier layer formed on the sidewalls and the bottom surface but not filling the opening, a conductive layer formed over the barrier layer and filing the opening, the damascene structure including an upper surface being essentially planar with the top surface, wherein the titanium-tantalum barrier layer is a composite film including a titanium film formed on the sidewalls and the bottom surface, and a tantalum film formed over the titanium film, the conductive layer being formed over the tantalum film.

* * * * *